United States Patent
Lin (10) Patent No.: US 8,502,713 B1
(45) Date of Patent: Aug. 6, 2013

(54) PIPELINED ANALOG TO DIGITAL CONVERTER AND METHOD FOR CORRECTING A VOLTAGE OFFSET INFLUENCE THEREOF

(75) Inventor: Jin-Fu Lin, Tainan (TW)

(73) Assignee: Himax Technologies Limited, Tainan (TW)

(*) Notice: Subject to any disclaimer, the term of this patent is extended or adjusted under 35 U.S.C. 154(b) by 0 days.

(21) Appl. No.: 13/470,701

(22) Filed: May 14, 2012

(51) Int. Cl.
*H03M 1/06* (2006.01)
(52) U.S. Cl.
USPC .......................................... 341/118; 341/161
(58) Field of Classification Search
USPC ................................... 341/118, 161
See application file for complete search history.

(56) References Cited

U.S. PATENT DOCUMENTS

| | | | | |
|---|---|---|---|---|
| 6,606,042 B2 * | 8/2003 | Sonkusale et al. | | 341/120 |
| 6,861,969 B1 * | 3/2005 | Ali | | 341/161 |
| 7,592,938 B2 * | 9/2009 | Hsueh et al. | | 341/118 |
| 7,595,744 B2 * | 9/2009 | Agarwal et al. | | 341/118 |

\* cited by examiner

*Primary Examiner* — Khai M Nguyen
(74) *Attorney, Agent, or Firm* — McClure, Qualey & Rodack, LLP (57) ABSTRACT

A method for correcting a voltage offset influence of a pipelined analog to digital converter is disclosed, in which the method generates a first stage code and a first output voltage according to a first input voltage, generates a second stage code according to the first output voltage, generates a check code according to the first output voltage, determines a first correction code by referring to the first stage code and the check code, and corrects the first stage code with the first correction code when the first stage code is different from the first correction code.

14 Claims, 13 Drawing Sheets

TABLE I

| c11 | c12 | c21 | c24 | MSB1 | LSB1 |
|-----|-----|-----|-----|------|------|
| 0   | 0   | 0   | 0   | 0    | 0    |
| 1   | 0   | 0   | 0   | 0    | 0    |
| 1   | 1   | 0   | 0   | 0    | 1    |
| 0   | 0   | 1   | 0   | 0    | 0    |
| 1   | 0   | 1   | 0   | 0    | 1    |
| 1   | 1   | 1   | 0   | 1    | 0    |
| 0   | 0   | 1   | 1   | 0    | 1    |
| 1   | 0   | 1   | 1   | 1    | 0    |
| 1   | 1   | 1   | 1   | 1    | 0    |

TABLE II

| c11 | c12 | c21 | c22 | c23 | c24 | MSB2 | LSB2 |
|---|---|---|---|---|---|---|---|
| 0 | 0 | 0 | 0 | 0 | 0 | 0 | 0 |
| 0 | 0 | 1 | 0 | 0 | 0 | 0 | 0 |
| 0 | 0 | 1 | 1 | 0 | 0 | 0 | 1 |
| 0 | 0 | 1 | 1 | 1 | 0 | 1 | 0 |
| 0 | 0 | 1 | 0 | 1 | 1 | 0 | 1 |
| 1 | 0 | 0 | 0 | 0 | 0 | 0 | 1 |
| 1 | 0 | 1 | 1 | 0 | 0 | 0 | 0 |
| 1 | 0 | 1 | 1 | 0 | 0 | 0 | 1 |
| 1 | 0 | 1 | 0 | 1 | 1 | 1 | 0 |
| 1 | 0 | 0 | 0 | 0 | 0 | 0 | 1 |
| 1 | 1 | 1 | 1 | 0 | 0 | 0 | 1 |
| 1 | 1 | 1 | 1 | 1 | 0 | 0 | 0 |
| 1 | 1 | 1 | 1 | 1 | 0 | 1 | 0 |
| 1 | 1 | 1 | 1 | 1 | 1 | 1 | 0 |

PIPELINED ANALOG TO DIGITAL CONVERTER AND METHOD FOR CORRECTING A VOLTAGE OFFSET INFLUENCE THEREOF

BACKGROUND

1. Field of Invention

The disclosure relates to analog-to-digital converter circuits. More particularly, the disclosure relates to an analog-to-digital converter (ADC) that includes an MDAC.

2. Description of Related Art

An analog-to-digital converter (ADC) is a device that takes an analog data signal and converts it into a digital code, i.e. digitizes or quantizes the analog signal. An ADC is a key building block in mixed-mode integrated circuits (ICs). Once the analog signal is converted into the digital domain, complicated signal processing functions can be performed with easier handling and improved noise immunity. In some instances, power dissipation can be reduced since many ADCs are implemented in a deep submicron CMOS process.

ADCs may employ a wide variety of architectures, such as the integrating, successive-approximation, flash, and the delta-sigma architectures. Recently, the pipelined analog-to-digital converter (ADC) has become a popular ADC architecture for use in high-speed applications such as CCD imaging, ultrasound medical imaging, digital video, and communication technologies such as cable modems and fast Ethernet. Pipelined ADCs are typically chosen because of their high accuracy, high throughput rate, and low power consumption. Moreover, the pipelined architecture generally provides better performance for a given power and semiconductor die area than other ADC architectures.

With the digital error correction, the pipelined ADC can tolerate a great comparator offset. However, in the advanced process in which case the supply voltage Vdd becomes lower, it is difficult to achieve a sufficient operating range (i.e. reference voltage), which reduces the tolerable range of the comparator offset.

Figure 1:
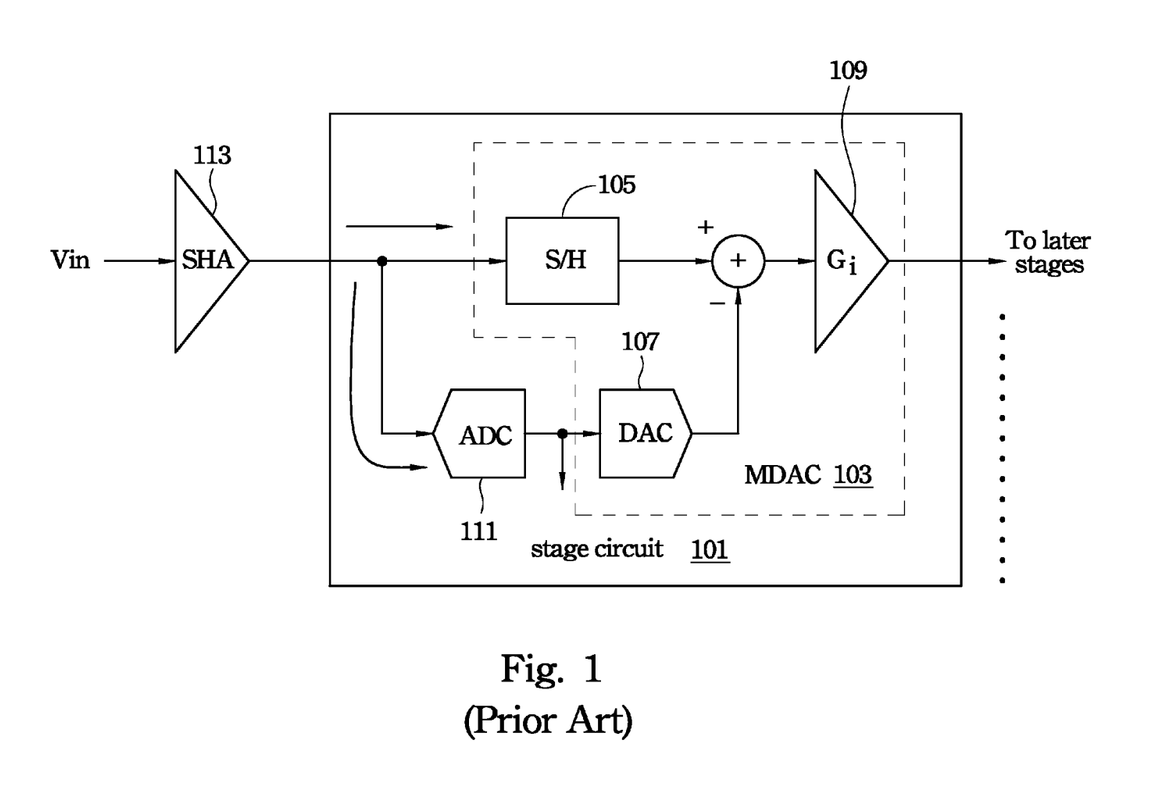
FIG. 1 and FIG. 2 show part circuit of the conventional pipelined ADC with sample and hold amplifier (SHA) and without the SHA.
Figure 2:
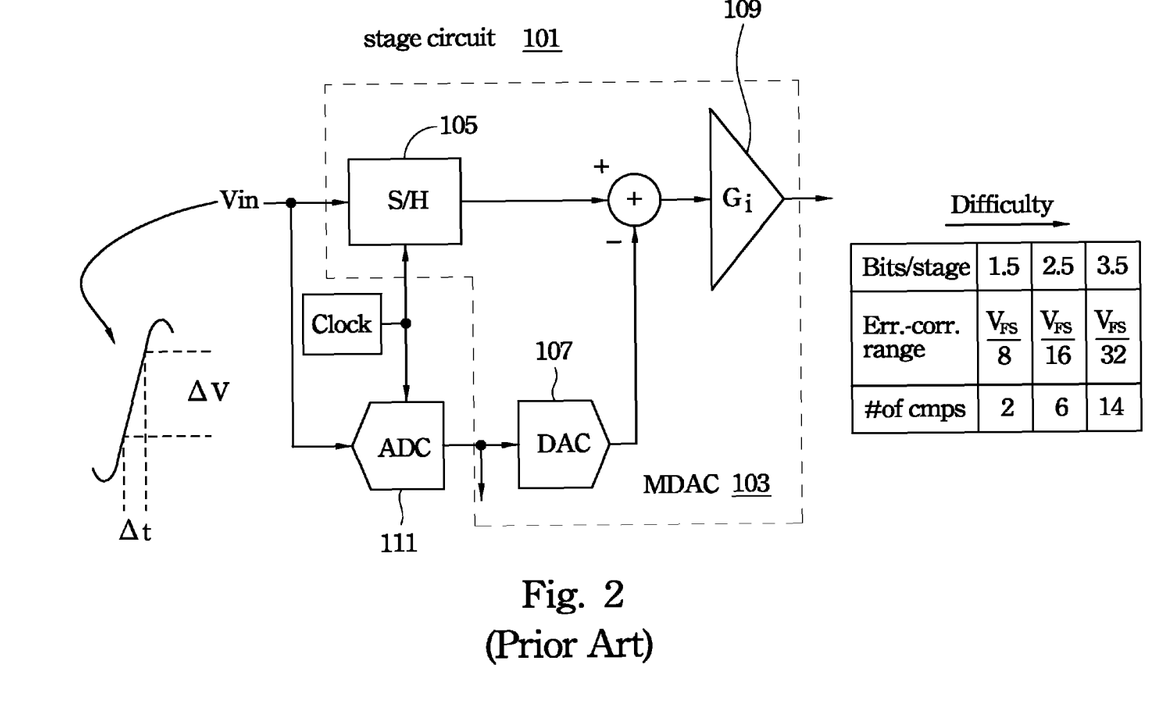

FIG. 1 and FIG. 2 show part circuit of the conventional pipelined ADC with sample and hold amplifier (SHA) and without SHA. The stage circuit 101 and the sample and hold amplifier (SHA) 113 are generally employed in the conventional pipelined ADC, in which the stage circuit 101 generally includes an analog to digital converter 111 and a MDAC 103 having a simple and hold (S/H) circuit 105, a digital to analog converter 107 and a amplifier 109. In order to provide stabled and synchronized signal for the stage MDAC 103 and sub-ADC 111 in the stage circuit 101 for sampling, the SHA 113 is used. However, the SHA 113 will increase power consumption and noise, therefore, low power pipelined ADC design usually does not adopt SHA 113, and the SHA-less architecture shown in FIG. 2 becomes popular.

However, an unavoidable time difference existing between the S/H 105 and the ADC 107 causes a sampling mismatch, and the signal-dependent offset which increases as fin is thus induced. As a result, the amount of the permissible comparator offset is reduced, and input signal bandwidth of the ADC is thus limited.

Figure 3:
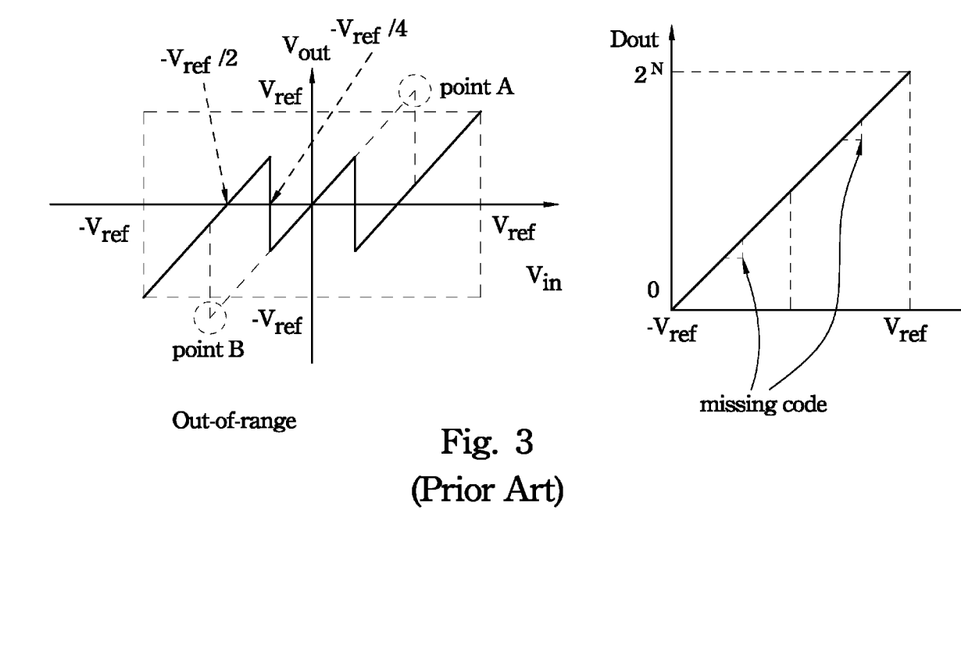
FIG. 3 and FIG. 4 show wave diagrams of an output voltage coming from a stage circuit of the conventional pipelined ADC.
Figure 4:
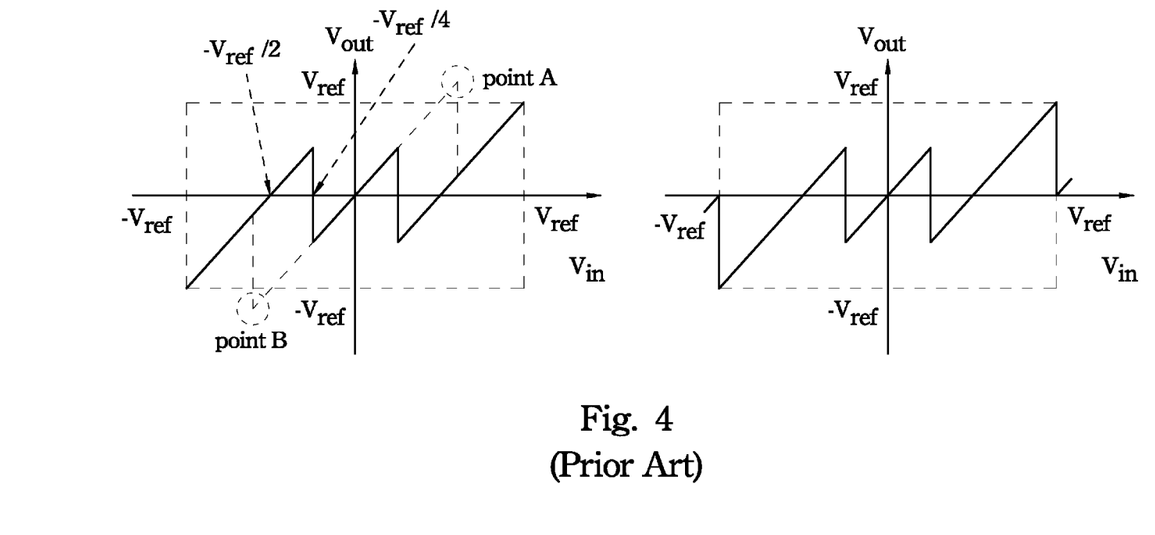

FIG. 3 and FIG. 4 show a wave diagram of an output voltage coming from a stage circuit of the pipelined ADC. Point A and the point B of FIG. 3 and FIG. 4 represent the situation in which case the comparator offset exceeds the normal operation range. Because the comparator offset will be amplified by the continuing stages, missing code and serious errors are caused as a result.

SUMMARY

According to one embodiment of the present invention, a method for correcting a voltage offset of a pipelined analog to digital converter is disclosed. The method generates a first stage code and a first output voltage according to a first input voltage, generates a second stage code according to the first output voltage, generates a check code according to the first output voltage, determines a first correction code by referring to the first stage code and the check code, and corrects the first stage code with the first correction code when the first stage code is different from the first correction code.

According to another embodiment of the present invention, a pipelined analog to digital converter (ADC) is disclosed. The pipelined analog to digital converter includes a check code generator, a code correction circuit, and a voltage offset correction circuit. The check code generator generates a check code according to a first output voltage of a first stage circuit of the pipelined ADC. The code correction circuit receives a first stage code, a second stage code, and the check code generated by a first stage circuit, a second stage circuit, and the check code generator of the pipelined ADC, respectively; the code correction circuit also corrects the first stage code and the second stage code in error by referring to the check code as well as the first stage code, and then transmitting the corrected first stage code and the corrected second stage code to a decoder logic circuit of the pipelined ADC. The voltage offset correction circuit adjusts magnitude of an output voltage of the second stage circuit according to the second stage code and the check code.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 5:
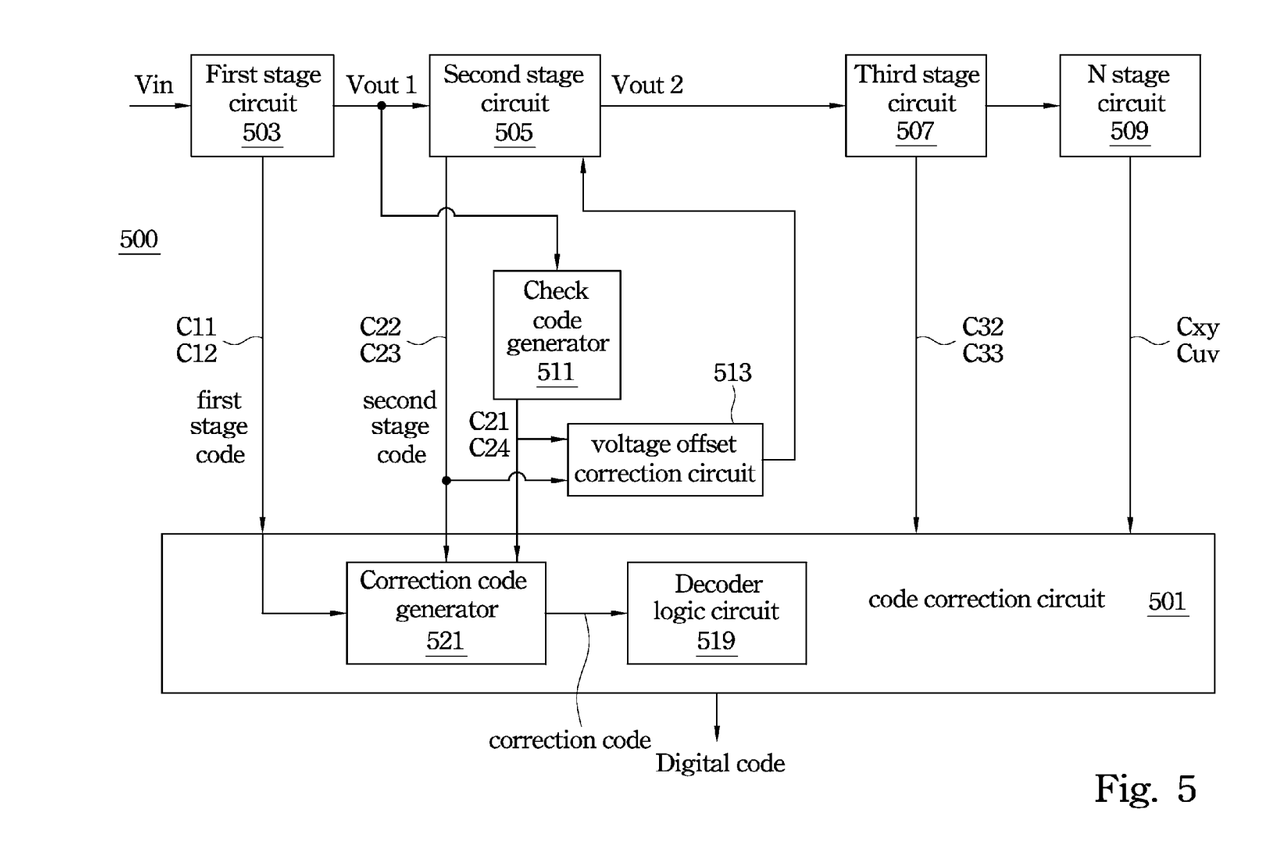
FIG. 5 shows a block diagram of a pipelined analog to digital converter (ADC) according to one embodiment of the present invention.

FIG. 5 shows a block diagram of a pipelined analog to digital converter (ADC) according to one embodiment of the present invention. The pipelined analog to digital converter 500 includes several stage circuits, that is, the first stage circuit 503, the second stage circuit 505, the third stage circuit 507 . . . until the N stage circuit. The pipelined analog to digital converter 500 further includes a check code generator 511, a voltage offset correction circuit 513, and a code correction circuit 501 having a correction code generator 521 and a decoder logic circuit 519 build therein.

The first stage circuit 503 receives an input voltage Vin and generates a first stage code C11, C12 as well as a first output voltage Vout1 according to the input voltage Vin, and the second stage circuit 505 generates a second stage code C22, C23 according to the first output voltage Vout1. Then, the check code generator 511 generates a check code C21, C24 according to the first output voltage Vout1.

The code correction circuit 501 receives the first stage code C11, C12, the second stage code C22, C23, and the check code C21, C24 respectively generated by the first stage circuit 503, the second stage circuit 505, and the check code generator 511 of the pipelined ADC. The code correction circuit 501 corrects the first stage code C11, C12 and the second stage code C22, C23 in error by referring to both the check code C21, C24 and the first stage code C11, C12. In more detail, the correction code generator 521 of the code correction circuit 501 generates the correction code by referring to the first stage code C11, C12, the second stage code C22, C23, and the check code C21, C24 then transmits the correction code to a decoder logic circuit 519 of the code correction circuit 501. Finally, the code correction circuit 501 outputs a digital code accordingly.

In addition, the voltage offset correction circuit 513 adjusts magnitude of an output voltage Vout2 of the second stage circuit 505 according to the second stage code C22, C23 and the check code C21, C24.

Figure 6:
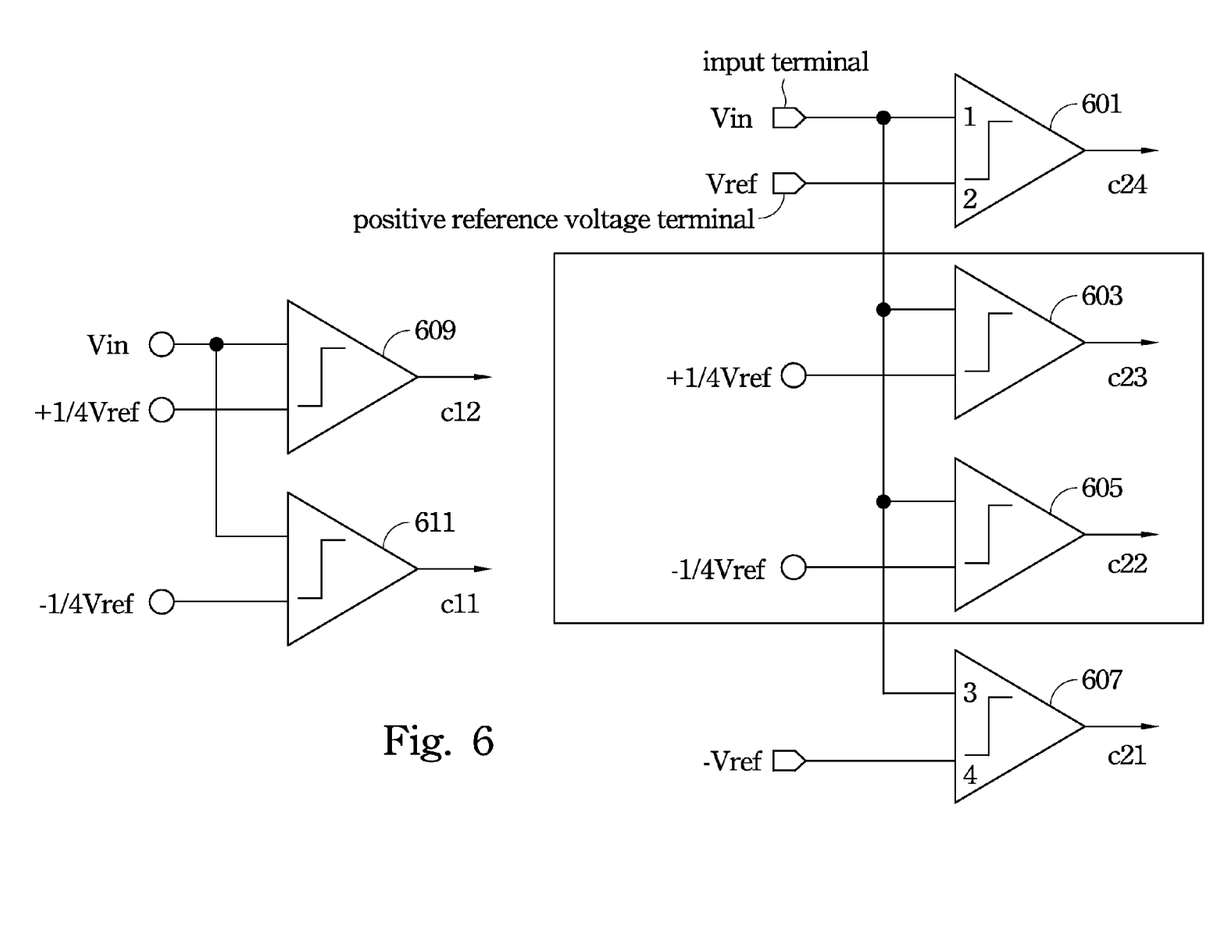
FIG. 6 shows a circuit diagram including a check code generator according to one embodiment of the present invention.

FIG. 6 shows a circuit diagram including a check code generator according to one embodiment of the present invention. As shown in FIG. 6, the first comparator 601 and the second comparator 607 are disposed in the check code generator, the third comparator 603 and the fourth comparator 605 are disposed in the second stage circuit. In addition, the fifth comparator 609 and the sixth comparator 611 are disposed within the first stage circuit.

The first comparator 601 has a first input terminal connected to an input terminal for receiving an input voltage Vin and having a second input terminal connected to a positive reference voltage terminal for receiving a positive reference voltage Vref. The second comparator 607 has a third input terminal connected to the input terminal for receiving the input voltage Vin and has a fourth input terminal connected to a negative reference voltage terminal for receiving a negative reference voltage –Vref.

The first comparator 601 and the second comparator 607 compare the input voltage Vin, the positive reference voltage Vref and the negative input terminal –Vref and output the check code C21, C24 accordingly.

Figure 7:
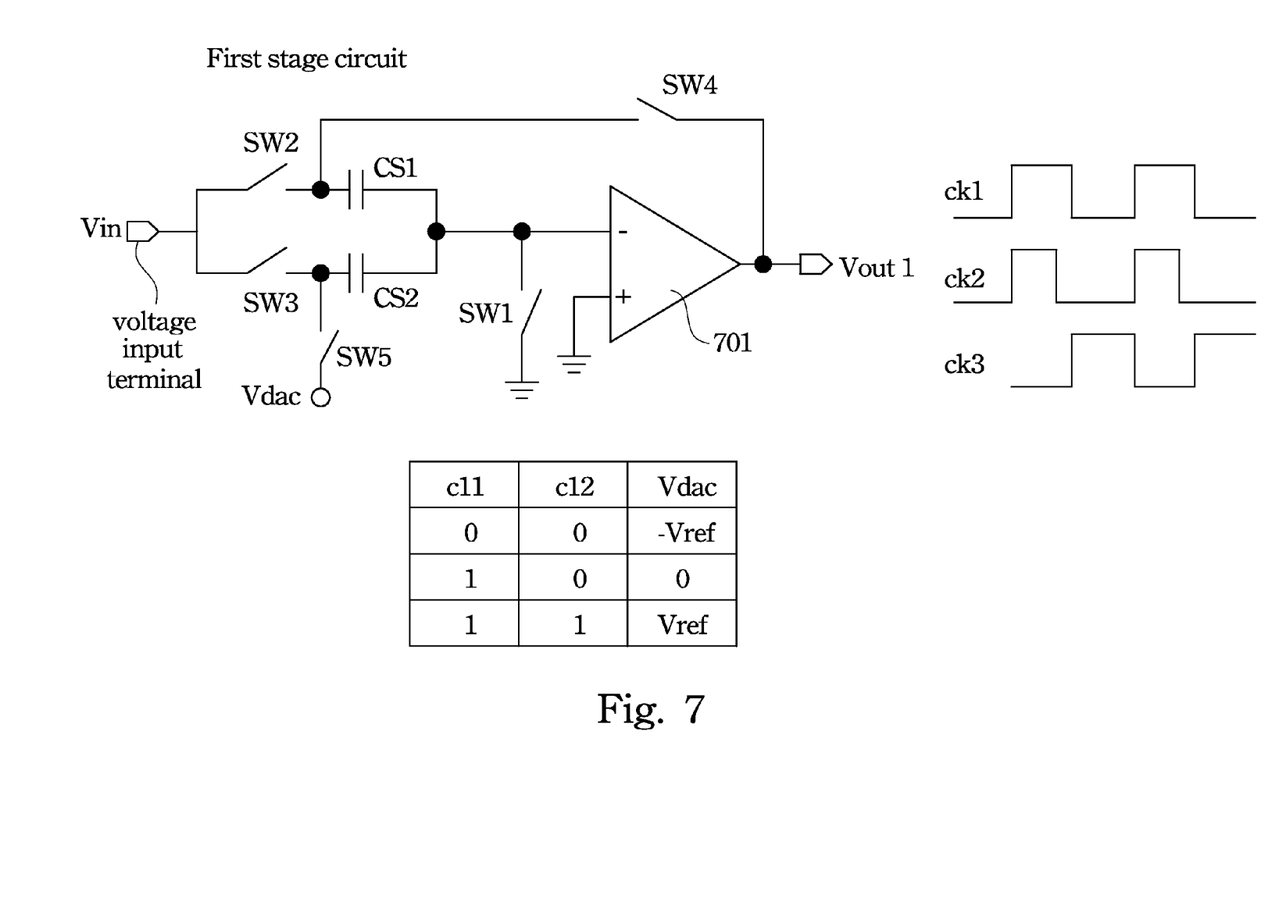
FIG. 7 shows a circuit diagram of a first stage circuit according to one embodiment of the present invention.

FIG. 7 shows a circuit diagram of a first stage circuit according to one embodiment of the present invention. The first stage circuit which is a part of the MDAC built in the stage circuits includes an operation amplifier 701, a first switch sw1, a second switch sw2, a third switch sw3, a fourth switch sw4, a fifth switch sw5, a first capacitor cs1, and a second capacitor cs2. The operation amplifier 701 has a positive input terminal + connected to a ground terminal, a negative input terminal –, and an output terminal.

The first switch sw1 is connected between the negative input terminal – and the ground terminal. The second switch sw2 and the third switch sw3 have first ends connected to a voltage input terminal for receiving an input voltage Vin. The first capacitor cs1 and the second capacitor cs2 have one ends connected to the negative input terminal – of the operation amplifier 701 and the other ends connected to second ends of the second switch sw2 and the third switch sw3. The fourth switch sw4 connected to the second end of the second switch sw2 and the output terminal of the operation amplifier 701. The fifth switch sw5 has one end connected to the second end of the third switch sw3 and the other end connected to a reference voltage input terminal Vdac.

The second switch sw2 as well as the third switch sw3 are controlled by a first clock signal ck1, the fourth switch sw4 as well as the fifth switch sw5 are controlled by a third clock signal ck3, and the first switch sw1 is controlled by a second clock signal ck2. The rising edges of the first clock signal ck1 and the second clock signal ck2 are aligned, and a falling edge of the third clock signal ck3 is aligned with the rising edges of the first clock signal ck1 and the second clock signal ck2. Particularly, a high level period of the first clock signal ck1 is longer than the high level period of the second clock signal ck3.

With such configuration and clock signal sequence, a reference voltage is subtracted from or added to the output voltage Vout1 directly coming from the first stage circuit when the first stage code is equal to 2'b00 or 2'b 11.

Figure 8:
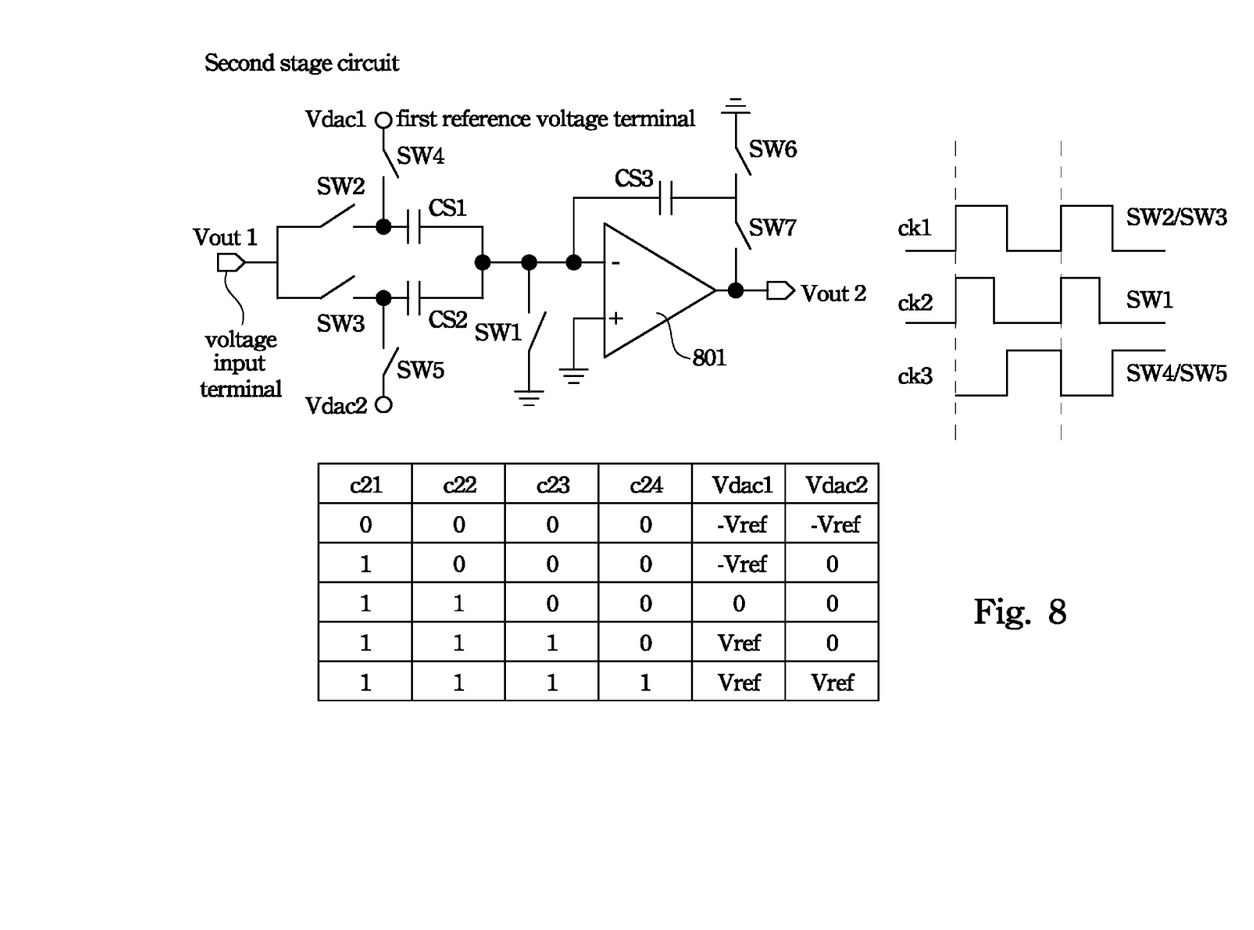
FIG. 8 shows a circuit diagram of a second stage circuit according to another embodiment of the present invention.

FIG. 8 shows a circuit diagram of a second stage circuit according to another embodiment of the present invention. The second stage circuit includes an operation amplifier 801, a first switch sw1, a second switch sw2, a third switch sw3, a fourth switch sw4, a fifth switch sw5, a sixth switch sw6, and a seventh switch sw7, a first capacitor cs1, a second capacitor cs2, and a third capacitor cs3. The operation amplifier 801 has a positive input terminal + connected to a ground terminal, and the third capacitor cs3 is connected between a negative input terminal – and an output terminal of the operation amplifier 801 through the seventh switch sw7.

The first switch sw1 is connected between the negative input terminal – and the ground terminal. The second switch sw2 and the third switch sw3 have first ends connected to a voltage input terminal for receiving an input voltage Vin. The first capacitor cs1 and the second capacitor cs2 have one ends connected to the negative input terminal – of the operation amplifier 801 and the other ends connected to second ends of the second switch sw2 and the third switch sw3. The fourth switch sw4 connected to the second end of the second switch sw2 and the first reference voltage terminal Vdac1. The fifth switch sw5 has one end connected to the second end of the third switch sw3 and the other end connected to a second reference voltage input terminal Vdac2.

The second switch sw2 as well as the third switch sw3 are controlled by a first clock signal ck1, the fourth switch sw4, the fifth switch sw5, as well as the seventh switch sw7 are controlled by a third clock signal ck3, and the first switch sw1 as well as the sixth switch sw6 are controlled by a first clock signal ck1. The rising edges of the first clock signal ck1 and the second clock signal ck2 are aligned, and a falling edge of the third clock signal ck3 is aligned with the rising edges of the first clock signal ck1 and the second clock signal ck2. Particularly, a high level period of the first clock signal ck1 is longer than the high level period of the second clock signal ck3.

With such circuit configuration and clock signal sequence, a reference voltage is subtracted from or added to the output voltage Vout2 coming from the second stage circuit when the second stage code as well as the check code are equal to 4'b 0000, 4'b 1000, 4'b 1110, or 4'b 1111.

Figure 9:
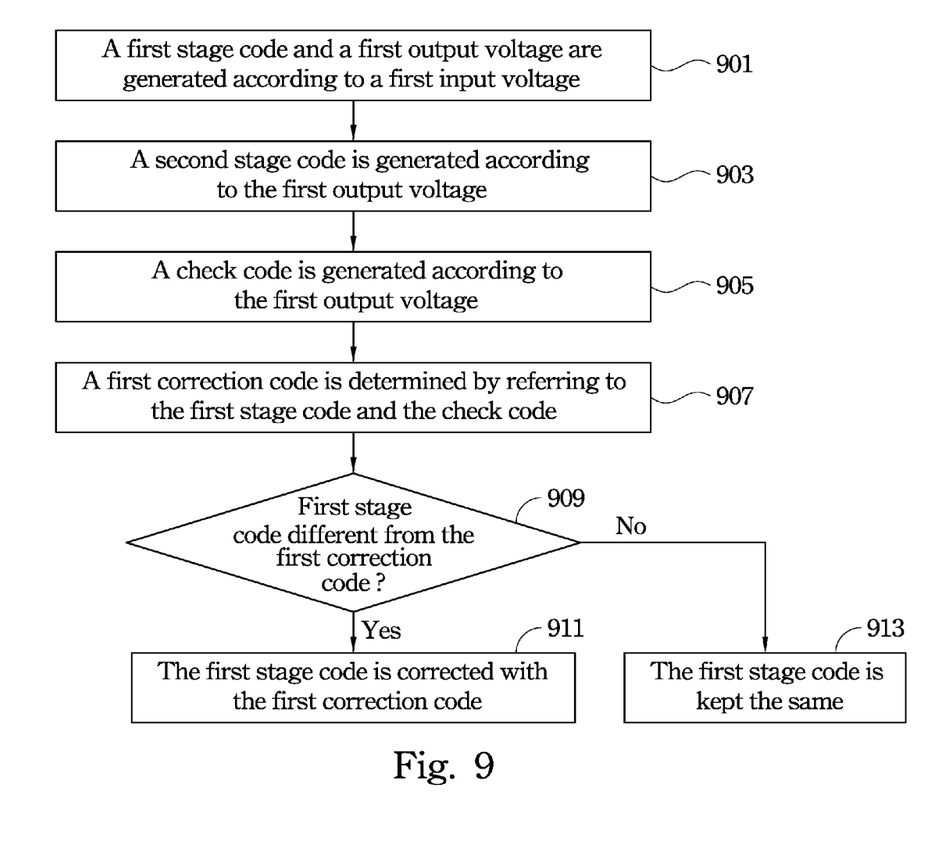
FIG. 9 is a flowchart of a method for correcting a voltage offset of a pipelined analog to digital converter according to one embodiment of the present invention.

FIG. 9 is a flowchart of a method for correcting a voltage offset influence of a pipelined analog to digital converter according to one embodiment of the present invention. In the steps for correcting the voltage offset influence, a first stage code and a first output voltage is first generated according to a first input voltage (step 901), and a second stage code is generated according to the first output voltage (step 903). Next, a check code is generated according to the first output voltage (step 905), and a first correction code is determined by referring to the first stage code and the check code (step 907).

After that, the first stage code is checked if it is different from the first correction code (step 909). The first stage code is corrected with the first correction code when the first stage code is different from the first correction code (step 911), and a second output voltage of the second stage circuit is adjusted by a positive reference voltage (+Vref) or a negative reference voltage (-Vref). For example, if the second output voltage is too high, a reference voltage can be subtracted from the second output voltage to decrease the second output voltage.

Figure 10:
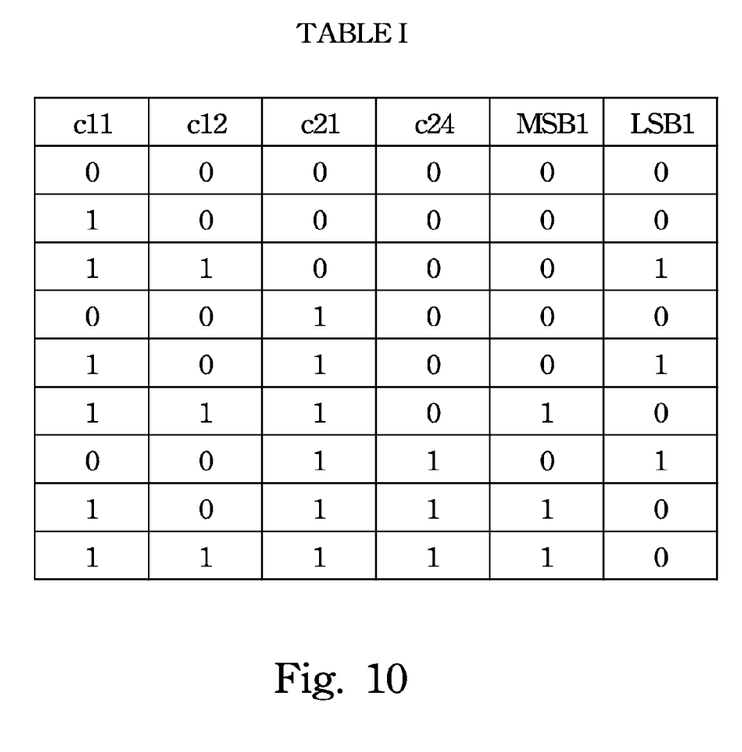
FIG. 10 shows a code table identifying normal and false statue of a pipelined ADC according to one embodiment of the present invention.
Figure 11:
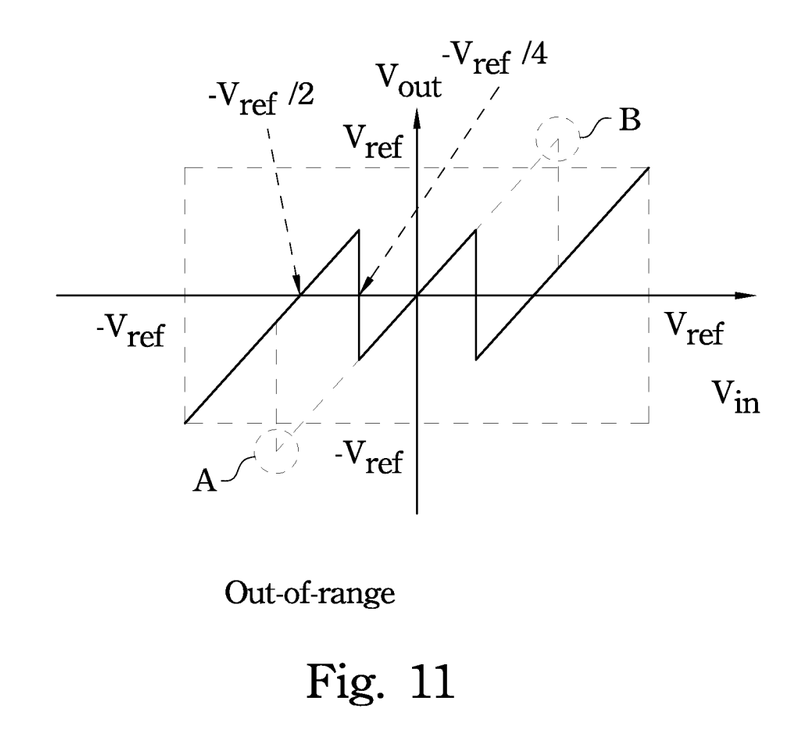
FIG. 11 shows a waveform diagram of an output voltage coming from a stage circuit of the pipelined ADC according to one embodiment of the present invention.

Specifically, the check code is generated by comparing the first output voltage with a positive reference voltage (+Vref) and a negative reference voltage (-Vref). As presented in table I in FIG. 10 and the waveform in FIG. 11, when the first output voltage is out of range and lower than -Vref (point A in FIG. 11), the missing code will be caused if the stage code and the output voltage are not corrected. In order to prevent the missing code from happening, the check code (c21, c24) equal to 2'b00 and the first correction code (MSB1, LSB1) equal to 2'b00 or 2'b01 are generated for replacing the first stage code in error.

In another case, when the first output voltage is greater than +Vref and is out of range (point B in FIG. 11), the check code (c21, c24) equal to 2'b11 and the first correction code (MSB1, LSB1) equal to 2'b01 or 2'b10 are generated.

Figure 12:
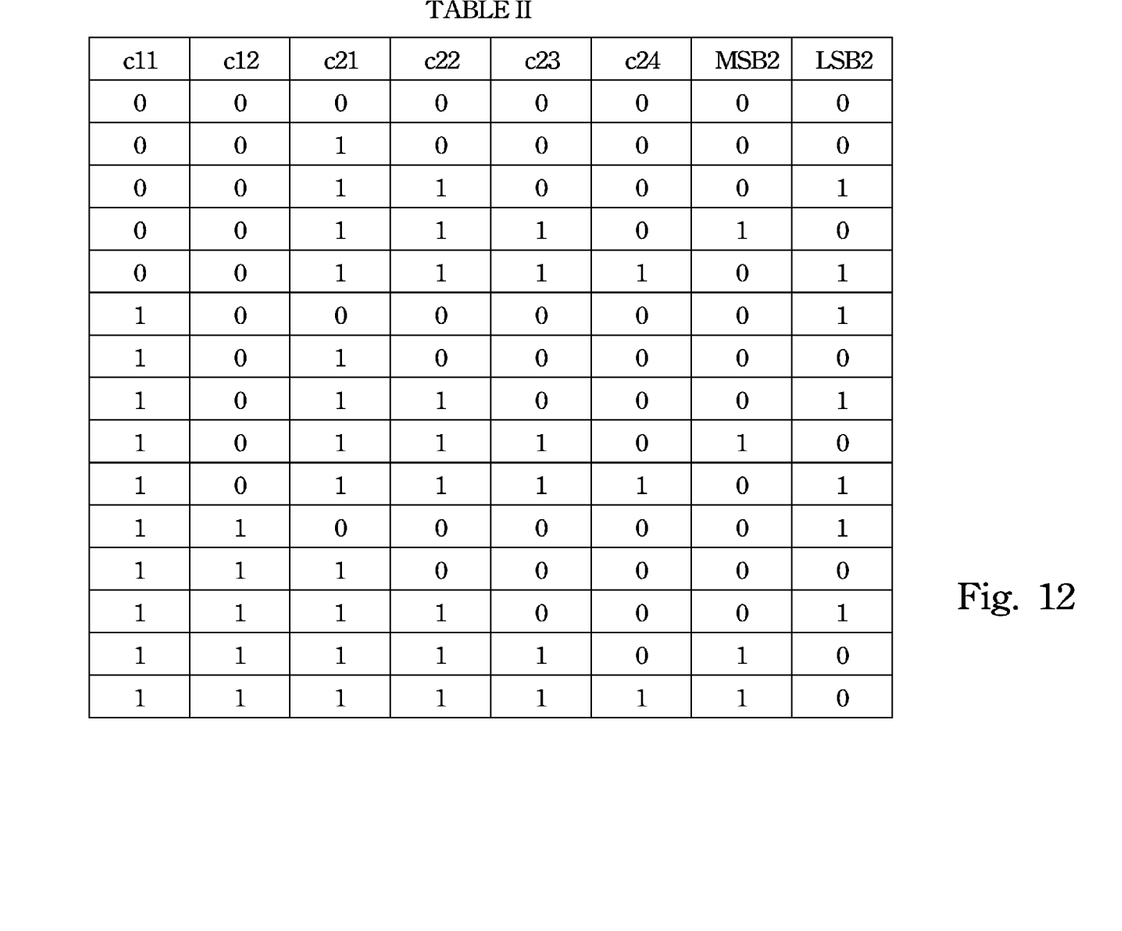
FIG. 12 shows a code table identifying normal and false statue of the pipelined ADC according to another embodiment of the present invention.
Figure 13:
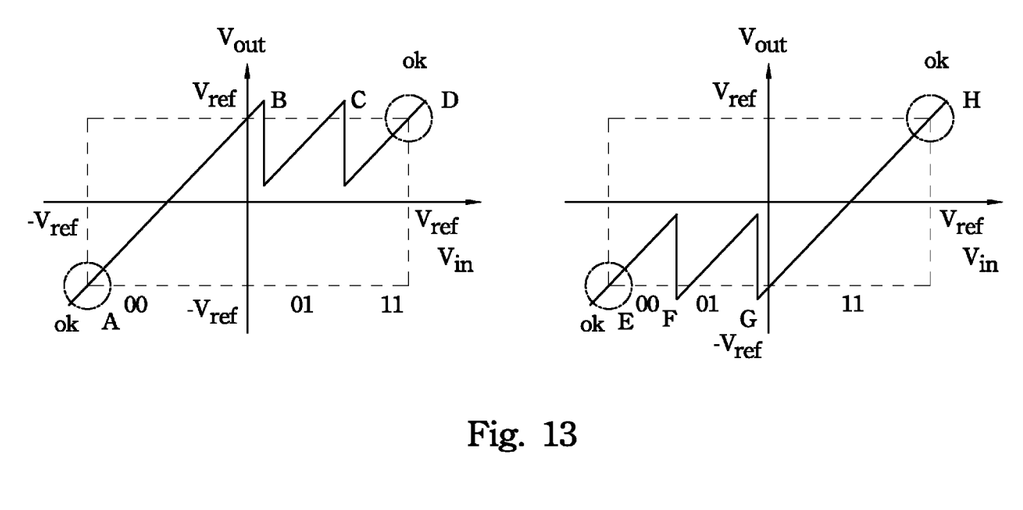
FIG. 13 shows waveform diagrams of an output voltage coming from a stage circuit of the pipelined ADC according to another embodiment of the present invention.

FIG. 12 shows a code table identifying normal and false statues of the pipelined ADC according to another embodiment of the present invention, and FIG. 13 shows waveform diagrams of an output voltage coming from a stage circuit of the pipelined ADC according to another embodiment of the present invention.

The embodiment presented in FIG. 12 and FIG. 13 further consider the situation that the input voltage is inherently greater than the positive reference voltage or less than the negative reference voltage, and the out of range voltage is not caused due to the comparator offset. The output voltages of point A, D, E, H shown in FIG. 13 are out of range since their original input voltages are inherently high, and these points do not need correction. On the other hand, points B, C, F, G are out of range due to the comparator offset, and these points need correction.

Therefore, the first stage code (c11, c12) is corrected by the first correction code (MSB2, LSB2) equal to 2'b 01 when the combination consisting of the first stage code, the check code, and the second stage code, i.e. C11~C24, is equal to the specific code 6'b 001111, 6'b100000, 6'b101111, and 6'b 110000.

On the other hand, if the first stage code is checked that it is not different from the first correction code in step 909, the first stage code is kept the same (step 913). Furthermore, the method can also determines a second correction code by referring to the first stage code, the second stage code, and the check code, then the method corrects the second stage code with the second correction code when the second stage code is different from the second correction code.

According to the above embodiment, the stage code in error and the out of range output voltage caused due to the comparator offset can be corrected in advance, and the missing code can be prevented as a result.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for correcting a voltage offset influence of a pipelined analog to digital converter, comprising:
   generating a first stage code and a first output voltage according to a first input voltage;
   generating a second stage code according to the first output voltage;
   generating a check code according to the first output voltage;
   determining a first correction code by referring to the first stage code and the check code; and
   correcting the first stage code with the first correction code when the first stage code is different from the first correction code.

2. The method for correcting the voltage offset influence of the pipelined analog to digital converter as claimed in claim 1, further comprising:
   when the first stage code is different from the first correction code, adjusting a second output voltage of the second stage circuit by a positive reference voltage or a negative reference voltage.

3. The method for correcting the voltage offset influence of the pipelined analog to digital converter as claimed in claim 1, wherein the check code is generated by comparing the first output voltage with a positive reference voltage and a negative reference voltage.

4. The method for correcting the voltage offset influence of the pipelined analog to digital converter as claimed in claim 1, wherein the first correction code is determined by referring to the first stage code and the check code in a look-up table.

5. The method for correcting the voltage offset influence of the pipelined analog to digital converter as claimed in claim 1, wherein the first stage code is corrected by the first correction code equal to 2'b 00 when the combination of the first stage code and the check code belongs to the specific code 4'b 1000.

6. The method for correcting the voltage offset influence of the pipelined analog to digital converter as claimed in claim 1, wherein the first stage code is corrected by the first correction code equal to 2'b 01 when the combination of the first stage code and the check code belongs to the specific code 4'b 0011.

7. The method for correcting the voltage offset influence of the pipelined analog to digital converter as claimed in claim 1, wherein the first stage code is corrected by the first correction code equal to 2'b 10 when the combination of the first stage code and the check code belongs to the specific code 4'b 1011.

8. The method for correcting the voltage offset influence of the pipelined analog to digital converter as claimed in claim 1, further comprising:
   determining a second correction code by referring to the first stage code, the second stage code, and the check code; and
   correcting the second stage code with the second correction code when the second stage code is different from the second correction code.

9. A pipelined analog to digital converter (ADC), comprising:
   a check code generator for generating a check code according to a first output voltage of a first stage circuit of the pipelined ADC;
   a code correction circuit for receiving a first stage code, a second stage code, and the check code respectively generated by a first stage circuit, a second stage circuit, and the check code generator of the pipelined ADC and for correcting the first stage code and the second stage code in error by referring to the check code, the first stage code, and the second stage code; and
   a voltage offset correction circuit for adjusting magnitude of an output voltage of the second stage circuit according to the second stage code and the check code.

10. The pipelined analog to digital converter as claimed in claim 9, wherein the check code generator comprises:
    a first comparator having a first input terminal connected to an input terminal for receiving an input voltage and having a second input terminal connected to a positive reference voltage terminal for receiving a positive reference voltage; and
    a second comparator having a third input terminal connected to the input terminal for receiving the input voltage and having a fourth input terminal connected to a negative reference voltage terminal for receiving a negative reference voltage.

11. The pipelined analog to digital converter as claimed in claim 9, wherein the first stage circuit comprises:
    an operation amplifier having a positive input terminal connected to a ground terminal, a negative input terminal, and an output terminal;
    a first switch connected between the negative input terminal and the ground terminal;
    a second switch and a third switch having first ends connected to a voltage input terminal for receiving an input voltage (Vin);
    a first capacitor and a second capacitor having one ends connected to the negative input terminal of the operation amplifier and the other ends connected to second ends of the second switch and the third switch;
    a fourth switch connected to the second end of the second switch and the output terminal of the operation amplifier; and
    a fifth switch having one end connected to the second end of the third switch and the other end connected to a reference voltage input terminal.

12. The pipelined analog to digital converter as claimed in claim 11, wherein the second switch and the third switch are controlled by a first clock signal, the fourth switch and the fifth switch are controlled by a third clock signal, and the first switch is controlled by a second clock signal.

13. The pipelined analog to digital converter as claimed in claim 12, wherein rising edges of the first clock signal and the second clock signal are aligned, and a falling edge of the third clock signal is aligned with the rising edges of the first clock signal and the second clock signal.

14. The pipelined analog to digital converter as claimed in claim 13, wherein a high level period of the first clock signal is greater than the high level period of the third clock signal.

\* \* \* \* \*